United States Patent [19]

Immorlica, Jr.

[11] Patent Number: 5,559,363

[45] Date of Patent: Sep. 24, 1996

[54] OFF-CHIP IMPEDANCE MATCHING UTILIZING A DIELECTRIC ELEMENT AND HIGH DENSITY INTERCONNECT TECHNOLOGY

[75] Inventor: Anthony A. Immorlica, Jr., Manlius, N.Y.

[73] Assignee: Martin Marietta Corporation, Bethesda, Md.

[21] Appl. No.: 469,706

[22] Filed: Jun. 6, 1995

[51] Int. Cl.[6] .............................. H01L 29/40; H01L 23/34
[52] U.S. Cl. .......................... 257/664; 257/691; 257/725; 257/728; 333/33; 333/246; 333/247; 361/730; 361/760
[58] Field of Search ..................... 257/664, 691, 257/725, 728; 361/729, 730, 760; 333/32, 33, 238, 246, 247

[56] References Cited

U.S. PATENT DOCUMENTS

| | | | |
|---|---|---|---|
| 4,780,177 | 10/1988 | Wojnarowski et al. | 156/643 |
| 4,783,695 | 11/1988 | Eichelberger et al. | 357/65 |
| 4,843,440 | 6/1989 | Huang | 257/750 |
| 4,873,566 | 10/1989 | Hokanson et al. | 257/703 |
| 4,882,200 | 11/1989 | Liu et al. | 427/53.1 |
| 4,953,001 | 8/1990 | Kaiser, Jr. et al. | 257/664 |
| 5,206,712 | 4/1993 | Kornrumpt et al. | 361/393 |
| 5,355,102 | 10/1994 | Kornrumpt et al. | 333/33 |
| 5,422,513 | 6/1995 | Marcinkiewicz et al. | 257/725 |

Primary Examiner—Rolf Hille
Assistant Examiner—David Ostrowski
Attorney, Agent, or Firm—Geoffrey H. Krauss

[57] ABSTRACT

A high-frequency, high-power, semiconductor device chip is impedance matched to an off-chip impedance by a matching network including a dielectric element located on a substrate ground plane portion adjacent to the device to be matched. A thin film dielectric layer is formed over the dielectric element, the semiconductor device and the surrounding substrate. A patterned metal matching circuit is disposed over the dielectric layer and is in electrical contact with an electrode of the high-frequency, high-power, semiconductor device. An impedance matching network is formed by the patterned metal circuit, the dielectric element, the dielectric layer and the underlying grounded substrate. The matching characteristics of the network can be tailored by selecting suitable dielectric materials for the dielectric element and by altering design of the patterned metal circuit. This fabrication of a high-density-interconnect (HDI) structure provides a method for altering the patterned metal circuit by laser lithography, such that a matching circuit can be uniquely tailored to the individual circuit during manufacture, and eliminating the need to mechanically tune the circuit or stock various versions of metallized substrates.

20 Claims, 3 Drawing Sheets

OFF-CHIP IMPEDANCE MATCHING UTILIZING A DIELECRIC ELEMENT AND HIGH DENSITY INTERCONNECT TECHNOLOGY

BACKGROUND OF THE INVENTION

1. Field of the Invention

This invention relates generally to impedance matching of high-frequency, high-power semiconductor devices and, more particularly, to impedance matching by use of a dielectric element in combination with high density interconnect (HDI) technology.

2. Description of Related Art

Electronic devices have inherent impedance characteristics associated with both inputs and outputs. These impedances dictate the transmission characteristics of each device. Impedance mismatches between interconnected devices and between sequential devices and transmission lines cause losses of power, gain and efficiency. Impedance is frequency dependent; the higher the operating frequency, the more noticeable mismatching effects become. In very high frequency devices, including monolithic microwave integrated circuits, impedance mismatches can render a circuit unusable.

By impedance matching we mean the practice of designing circuits to reduce impedance mismatches, thereby improving gain and efficiency of the circuit. Impedance matching techniques employ capacitive and inductive means to compensate for impedance differences.

It is known in the art to fabricate circuit modules having a substrate on which is located electronic devices (including integrated circuits chips and supporting components), microstrip circuits, DC supply lines, and logic lines. Electrical interconnections are then made using wire bonds or tab interconnections.

It is known in the art to match the impedances of the various devices of such a circuit by employing patterned metal matching strips over a dielectric material, where the dielectric material is situated above a ground plane. The patterned metal matching strips are usually formed using thin and thick film fabrication techniques. The resultant impedance matching characteristics are determined by the shape, width, thickness, and conductivity of both the patterned metal matching strips and the ground plane as well as by the shape, width, thickness and capacitive characteristics of the interposed dielectric material. These patterned metal strips can be used to connect one chip to another chip located on the same substrate or they can be used to connect a chip to a transmission line for connection to an external device.

Thin and thick film fabrication techniques and wire bond and tab interconnection techniques, however, have a number of disadvantages. Thin and thick film methods of fabricating circuitry on ceramic substrates have tolerance limitations which prevent such structures from being produced with microwave characteristics which are repeatable within close tolerances. As a result, there are frequently substrate-to-substrate variations in the impedance characteristics of such nominally identical substrates. In addition, active microwave components themselves have fabrication tolerances which result in variations in operating characteristics from device to device. Impedance discontinuities also vary with the actual placement of the chips on the surface, or in cavities, of the ceramic substrate. This is because slight changes in the positioning of a device alters the distance between the device and the substrate and result in variable interconnect bond lengths, thereby introducing additional impedance mismatches. Impedance mismatches also vary according to the materials employed in fabrication of the components, the substrates and the wire bond and tab interconnections. The cumulative effect of all of these differences is a wide range of system operating characteristics. Although matching patterns may be modified during manufacturing to compensate for these variations, such a practice becomes increasingly difficult as the number of chips on a substrate is increased.

Another drawback of these types of systems is the fact that many active microwave components cannot be accurately tested over their full expected operating frequency and power ranges in a non-destructive manner. Many components which pass preassembly testing, therefore, do not, in reality, meet specifications. Since few of these structures are designed to permit reworking or replacement of faulty components, neither the components nor their connections can be removed in a non-destructive manner. Manufacturing high frequency systems from such components is, therefore, a relatively low yield process in which many of the resulting systems do not meet specifications. It is desirable to increase yield by employing a deformable type of component interconnect, such as the HDI system.

A high density interconnect (HDI) system offers many advantages in the compact assembly of digital systems employing semiconductor devices and other electronic systems. For example, an electronic system incorporating between 30 and 50 chips can be fully assembled and interconnected on a single substrate 2 inches long by 2 inches wide by 0.050 inch thick. More importantly, the system can be disassembled for repair or replacement of a faulty component or interconnection. The system can then reassembled without significant risk to the system's good components. This is especially important where particularly expensive chips are incorporated into a system.

Briefly, in this high density interconnect system, a ceramic substrate, such as alumina, which may be 25–100 mils thick and of appropriate size and strength for the overall system, is provided. This size is typically less than 2 inches square but may be larger or smaller. Once the position of the various chips has been specified, individual cavities are formed having appropriate depths at the intended locations of the chips. Conventional laser or ultrasonic milling may be used to form the cavities in which the various chips and other components will be positioned. Where it is desired to place chips edge-to-edge, a single large cavity is satisfactory. Typically the cavity or cavities will be of substantially uniform depth. Where a particularly thick or a particularly thin component will be placed, however, the cavity bottom must be made respectively deeper or shallower to ensure that the upper surface of that component will lie substantially in the same plane as the upper surface of the rest of the components and in the same plane formed by the upper surface of the substrate surrounding the cavity. The bottom of each cavity is provided with a conductive epoxy or eutectic solder layer used to attach the various components which are placed in their desired locations within each cavity.

Thereafter, a film (which may be "KAPTON"® polyimide, available from E. I. du Pont de Nemours Company, Wilmington, Del.), of a thickness of approximately 0.0005–0.003 inches (approx. 12.5–75 microns), is pretreated by reactive ion etching (RIE) to promote adhesion. The substrate and chips must then be coated with "ULTEM 1000"® polyetherimide resin or another thermoplastic adhesive to adhere the "KAPTON"® resin film when it is laminated across the tops of the chips and across any other components and the exposed portion of the substrate.

Next, via holes are provided through the "KAPTON"® resin film and "ULTEM"® resin layers at locations in alignment with the terminals on the electronic components to which it is desired to make contact.

A metallization layer, comprising a first sub-layer of titanium (approximately 1000Å) and a second sub-layer of copper (approximately 2000Å), is sputter deposited over the "KAPTON"® resin layer, extending into the via holes to make electrical contact to the terminals disposed thereunder. The sputtered copper provides a seed layer for copper electroplating (3 to 4 microns thick). A final sub-layer of titanium (100Å) is sputter deposited to complete the Ti/Cu/Ti multi-layer metallization. This metallization layer is then patterned to form individual conductors using photoresist and etching. The photoresist is preferably exposed using a laser to provide an accurately aligned conductor pattern at the end of the process. Alternatively, exposure through a mask may be used.

Additional dielectric and metallization layers are provided as required in order to provide all of the desired electrical connections among the chips. Any mispositioning of the individual electronic components is compensated for by adaptive laser lithography.

This high density interconnect structure provides many advantages. Included among these are the lightest weight and smallest volume packaging of such an electronic system presently available. A further advantage of this high density interconnect structure is the short time required to design and fabricate a system using this high density interconnect structure. Prior art processes require individual prepackaging of each semiconductor device. Prior art processes also require multi-layer circuit boards to interconnect the individual semiconductor devices. Multi-layer circuit boards are expensive and require substantial lead time for their fabrication. In contrast, the only element which must be specially pre-fabricated for the HDI system is the substrate on which the individual semiconductor chips will be mounted. This substrate is a standard stock item, except where cavities of various depths are required. Such cavities may be formed in an already fired ceramic substrate by conventional or laser milling. This process is straight forward and fairly rapid. Once a desired configuration of the substrate is established, cavities can be prepared in a substrate and the semiconductor chips can be mounted in as little as one day.

High density interconnect structures have also been developed for microwave systems. Developments include air gaps over sensitive microwave structures, test terminals and impedance matching circuits.

High density interconnect structures, methods of fabrication it and tools for fabrication disclosed in U.S. Pat. No. 4,783,695, "Multichip Integrated Circuit Packaging Configuration and Method," by Eichelberger, et al.; U.S. Pat. No. 5,206,712, "Building Block Approach to Microwave Modules," by Kornrumpf, et al.; and U.S. Pat. No. 5,355,102, "HDI Impedance Matched Microwave Circuit Assembly," by Kornrumpf, et al. These patents, including the references cited therein, are hereby incorporated in their entireties by reference.

As disclosed and claimed in the last-mentioned patent, located in a substrate is a chip having an electrode whose impedance is to be matched. A first dielectric layer is formed over the chip and the surrounding substrate. A via hole is formed in the dielectric layer to expose the electrode. A first patterned metal layer is formed over the first dielectric layer, making contact with the microwave terminals on the chips through the via holes. A second dielectric layer is formed over the patterned metal layer. A second patterned metal layer is then formed over the second dielectric layer. The second patterned metal layer is grounded. An impedance matching capacitor is formed by the first patterned metal layer, the grounded second patterned metal layer, and the second dielectric layer located between the two metal layers. The matching characteristics of the capacitor vary according to the shape and surface area of the patterned metal layers and by the thickness, shape and dielectric properties of the second dielectric layer.

The impedance matched circuit taught in the above mentioned patent, while useful for low to moderate power applications, may not, however, be suitable for all high power applications. This is because impedance matching of some high power circuits requires relatively high capacitive values with relatively small areas. High capacitive values are achieved by employing dielectric materials having high dielectric constants, by increasing the surface area of the patterned metal conductors, by decreasing the thickness of the dielectric material, or through some combination of the above. However, due to the small variety of materials suitable for use as a dielectric layer and the relatively small surface areas available, high capacitive values are achieved primarily by stretching the dielectric layer extremely thin. This, however, may cause tears in the dielectric layer or leave the dielectric layer so thin that electrical arcing between the matching circuit and the ground plane may occur. Consequently, it is desired to provide an improved high density interconnect structure for impedance matching of high-power, high-frequency integrated circuits.

OBJECTS OF THE INVENTION

Accordingly, a primary object of the present invention is to provide a high density interconnect structure suitable for interconnecting active and passive semiconductor devices in a manner which provides reliable impedance matching characteristics even at high-frequency, high-power operation.

A further object is to provide for custom optimization of the impedance match to take into account the manufacturers variations of each actual device, whether of power, small signal or low noise type.

SUMMARY OF THE INVENTION

In accordance with the invention, a dielectric element having a high dielectric constant $\epsilon$, (i.e. $\epsilon > 4$), is located on top of a ground plane, which may itself be on the top surface of a substrate. A semiconductor device having an electrode is located on the same substrate and adjacent to the dielectric element. A layer of dielectric material is formed over the semiconductor device, the dielectric element and a surrounding portion of the substrate. A via hole is formed in the dielectric layer to expose the electrode on the semiconductor device. A patterned metal matching circuit is formed over the dielectric layer and over the dielectric element. The patterned metal matching circuit makes electrical contact with the electrode on the device through the via hole. An impedance matching circuit is formed by the patterned metal matching circuit and the ground plane which are separated by the dielectric element and the dielectric layer. This impedance matching circuit contains primarily transmission line elements and capacitors and may also contain resistors, distributed resistors, transmission line inductor(s) and a capacitor. The material used for the dielectric element is chosen, and the patterned metal layer is designed, so as to provide the matching characteristics desired of the circuit. Because a variety of high-ε dielectric materials are suitable for use as a dielectric element, high capacitive values are achievable without necessitating the stretching of HDI dielectric layers.

The matching circuit provides predictable impedance characteristics, even at high power levels. The high density interconnect system permits removal and replacement of either the patterned metal matching circuit alone or the patterned metal matching circuit and the dielectric element. The patterned metal matching circuit can be modified for each semiconductor chip by laser lithography, thus eliminating the need to either have a number of slightly different circuits to account for chip tolerance, or use modified wire bonds to "tune" the matching circuit.

BRIEF DESCRIPTION OF THE DRAWINGS

The subject matter which is regarded as the invention is particularly pointed out and distinctly claimed in the concluding portion of the specification. The invention, together with further objects and advantages thereof, may best be understood by reference to the following description taken in connection with the accompanying drawings in which:

DETAILED DESCRIPTION

Figure 1:
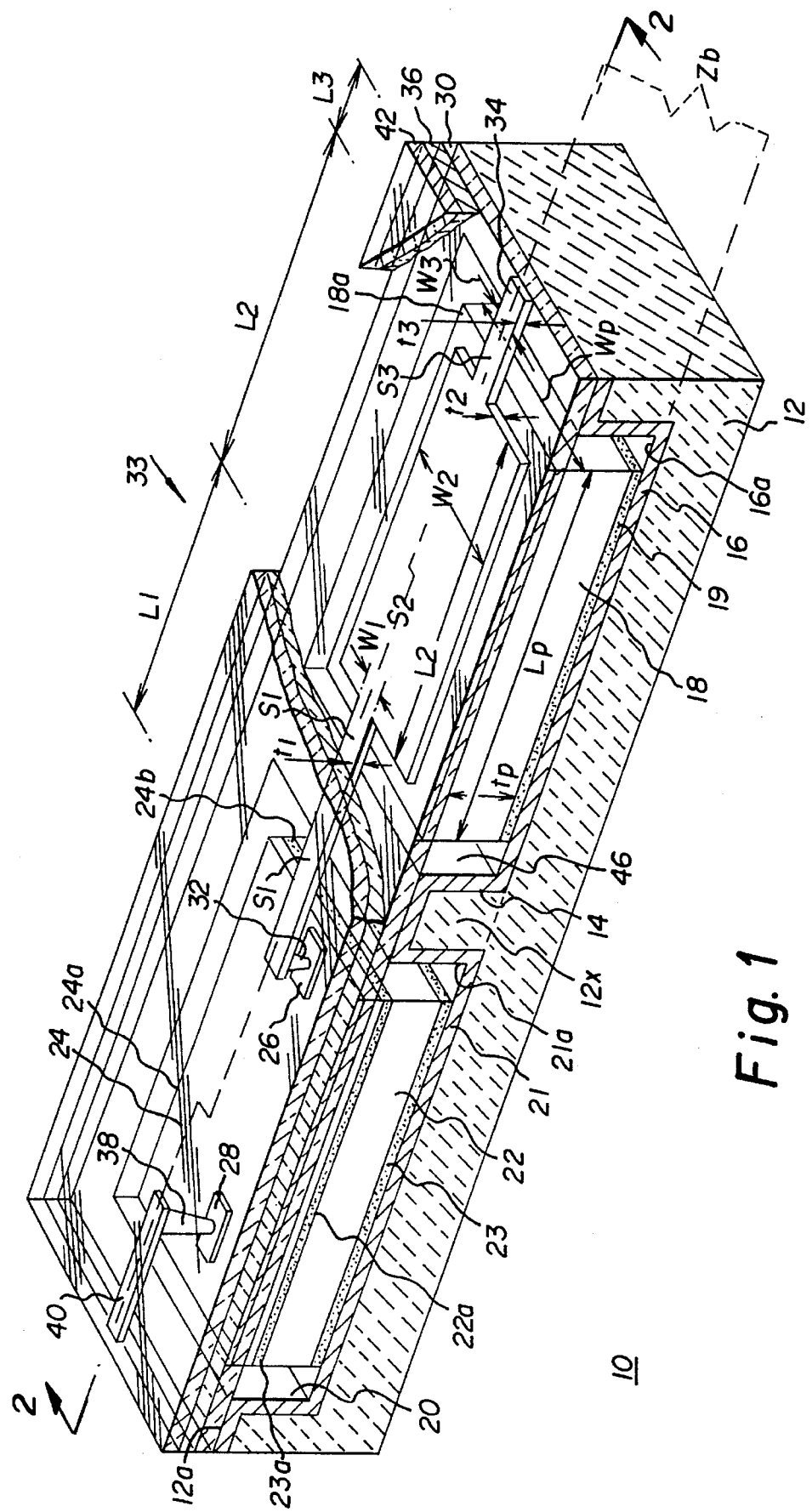
FIG. 1 is a cut-away perspective view of semiconductor device employing a dielectric element in a high density interconnect structure to match the device's impedance.
Figure 2:
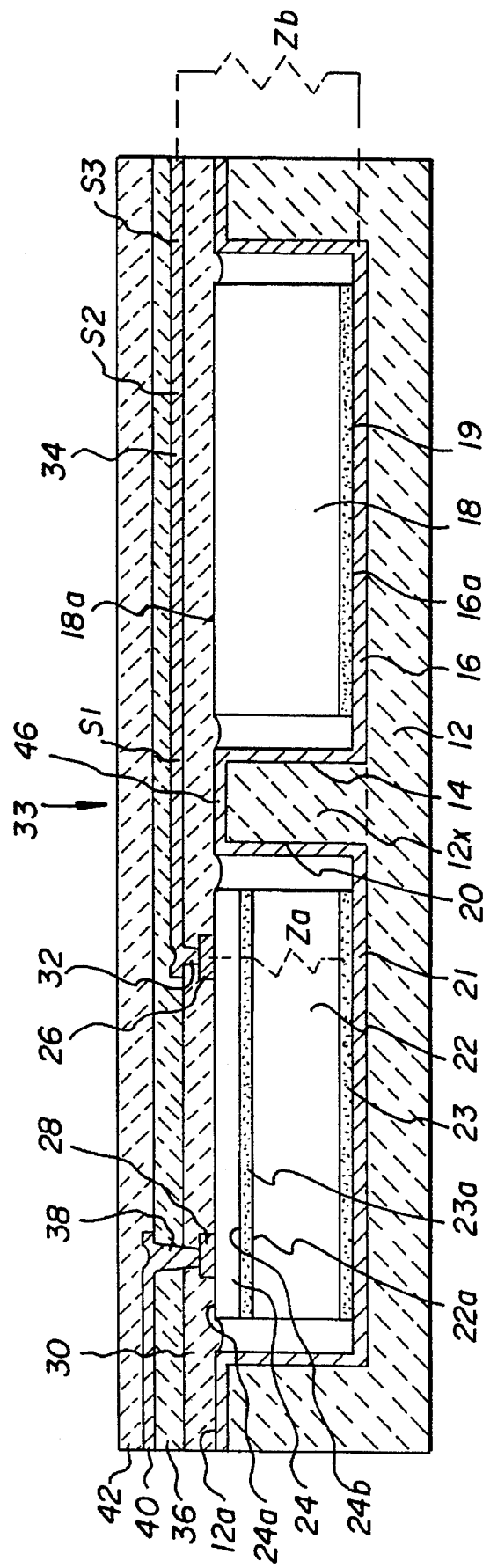
FIG. 2 is a cross-sectional view of the device of FIG. 1 viewed along the line 2—2.

Referring to FIGS. 1 and 2, a multichip RF module 10 has a substrate 12 with a first RF chip-well 14 formed in a top surface 12a thereof. A first ground plane conductor 16 (having an upper surface 16a) is disposed over substrate surface 12a and within chip-well 14 or, alternatively, substrate 12 itself may be conductive and grounded, thereby performing the same function as first ground plane conductor 16. Whichever option is used, ground plane conductor 16 or a grounded substrate 12 serves as a ground plate of a capacitive matching circuit.

In accordance with the invention, a dielectric element 18, formed from a dielectric material with a dielectric constant ($\epsilon_1$), has an upper surface 18a, a width $W_p$, a length $L_p$, and a thickness $t_p$. Dielectric element 18 is disposed upon ground plane upper surface 16a and may be bonded thereto with a layer 19 of conductive epoxy or metal solder or other suitable adhesive. Dielectric element 18 may be fabricated from a variety of materials depending upon the dielectric properties desired. Generally, a high dielectric constant (i.e. $\epsilon_1>4$) is desired. Blends of materials are currently available having a dielectric constant ε ranging from about 6 to at least 150. These include BeO (ε=6.7); AlN (ε=8.8); $Al_2O_3$ (ε=9.8); (MgCa) $TiO_3$ (ε ranging from 18 to 140); $ZrSnTiO_2$ (ε=38); and $CaTiO_3$ (ε=152). Operating frequency of the device to be matched must also be considered in choosing suitable dielectric materials. Although dielectric element 18 is illustrated in FIGS. 1 as a rectangular tile, it is contemplated that element 18 may be fabricated into any of a variety of shapes depending on the properties desired. Square, round, rectangular; constant, stepped or gradually varying thicknesses are but a few of the possible element 18 shape variations.

Substrate 12 has a second RF chip-well 20 formed in top surface 12a; the second chip-well may, or may not, be contiguous with first chip-well 14. A second ground plane conductor 21, having an upper surface 21a, may optionally be disposed within second chip-well 20 or, alternatively, substrate 12 itself may itself be conductive and perform the same function as second ground plane conductor 21. Second ground plane conductor 21, is in electrical contact with first ground plane conductor 16.

A heat sink 22 having an upper surface 22a may optionally be disposed within (and bonded to, via adhesive layer 23) second chip-well 20 directly on substrate 12 or, alternatively, upon upper surface 21a of second ground plane conductor 21 if second ground plane conductor 21 is used. Heat sink 22 may preferably be formed of a high thermal conductivity material with a coefficient of thermal expansion similar to the semiconductor chip 24. Examples include: molybdenum; a copper/molybdenum/copper lamination having a thickness ratio in the case of GaAs of 20/60/20; "Silvar", a silver/invar alloy made by Texas Instruments in Attleboro, Mass., and the like.

A semiconductor device 24 (having an upper surface 24a) is disposed within chip-well 20 (and may be bonded by adhesive layer 23a) with its bottom surface 24b directly on the upper surface of substrate 12, second ground plane upper surface 21a, (if present) or on heat sink upper surface 22a, (if present). Adhesive layers 19, 23 and 23a may comprise the same materials or they may differ from one another, depending on the use of multichip module 10. Semiconductor device 24 may be an active or passive RF device whose operating frequency lies anywhere from HF to microwave frequencies. Semiconductor device 24 has at least one electrode 26 disposed on upper surface 24a, and may have other electrodes 28. Semiconductor device 24 also has an impedance $Z_a$ between electrode 26 and ground plane 16, which impedance is to be matched to an external impedance $Z_b$.

First chip-well 14 and second chip-well 20 may have different depths depending on the dimensions of first ground plane conductor 16, second ground plane conductor 21, dielectric element 18, semiconductor device 24, and heat sink 22. First chip-well 14 and second chip-well 20 should each have a depth which ensures that dielectric element upper surface 18a and semiconductor device upper surface 24a lie substantially in the same plane as substrate upper surface 12a.

In an alternative embodiment, dielectric element 18 and semiconductor device 24 may be disposed within a single large chip-well 46 which will result if substrate barrier 12x is removed and chip-wells 14 and 20 extend into one another.

A continuous first thin dielectric layer 30, formed from a relatively-low dielectric constant ($\epsilon_r$) material, is deposited over substrate 12, dielectric element 18 and semiconductor device 24. Dielectric layer 30 must be capable of: (1) having via holes 32 formed therethrough (as by laser drilling and the like processes); (2) receiving a patterned metal layer (as by sputter deposition followed by photolithographic etching and the like processes); and (3) being compatible with semiconductor device 24 and dielectric element 18.

One class of films which meet the above properties is polytetrafluoroparaxlene (Parylene) or a derivative therefrom. One of these film derivatives, Parylene-F, having a relatively low dielectric constant ($\epsilon_r$=2.4), can: be vapor phase deposited onto substrates near room temperature, be deposited in thicknesses ranging from several tenths of a micron (i.e. $1 \times 10^{-6}$ Meters) to several tens of microns; provide planar coatings; be compatible with the temperatures inherent in the high density interconnect processes; and be drilled to form via holes. Other suitable low-dielectric-constant materials include the class of polyimides. It should be understood, however, that any polymer material which exhibits suitable characteristics is within the scope of the present invention.

Once dielectric layer 30 is deposited, via hole 32 can be formed therein to expose electrode 26. Via hole 32 may be formed by laser ablation, as taught in the related high density interconnect patents referred to herein, with the hole then being thoroughly cleaned with a $CF_6$-$O_2$ plasma etch to ensure that there is no debris in the bottom of the via hole which would interfere with making electrical contact to the underlying electrode 26.

An impedance matching circuit 33 is formed, in part, by patterned metal layer 34 formed over dielectric layer 30. Patterned metal layer 34 is in electrical contact with electrode 26 through via hole 32 and extends from electrode 26 over dielectric element 18 to impedance $Z_b$. Patterned metal layer 34 does not make direct contact with dielectric element 18. Patterned metal layer 34 may be formed in a variety of manners: One alternative is to form a single continuous metal layer and to then photolithographically define the portions of that metal layer to be retained and then etch off the metal which is not to be retained, thereby leaving the desired matching circuit pattern of layer 34; another alternative is to form the metal matching circuit layer 34 pattern directly in a patterned manner by the use of photo-induced selective deposition of either the metal layer itself or of a catalyst which facilitates electroless deposition of the metal layer. These techniques are explained in greater detail in, for example background high density interconnect patents and applications, U.S. Pat. No. 4,780,177, "Excimer Laser Patterning of a Novel Resist," by Wojnarowski et. al., U.S. Pat. No. 4,882,200, "Method for Photopatterning Metallization Via UV-Laser Ablation of the Activator," by Liu et. al., and the like.

Figure 3:
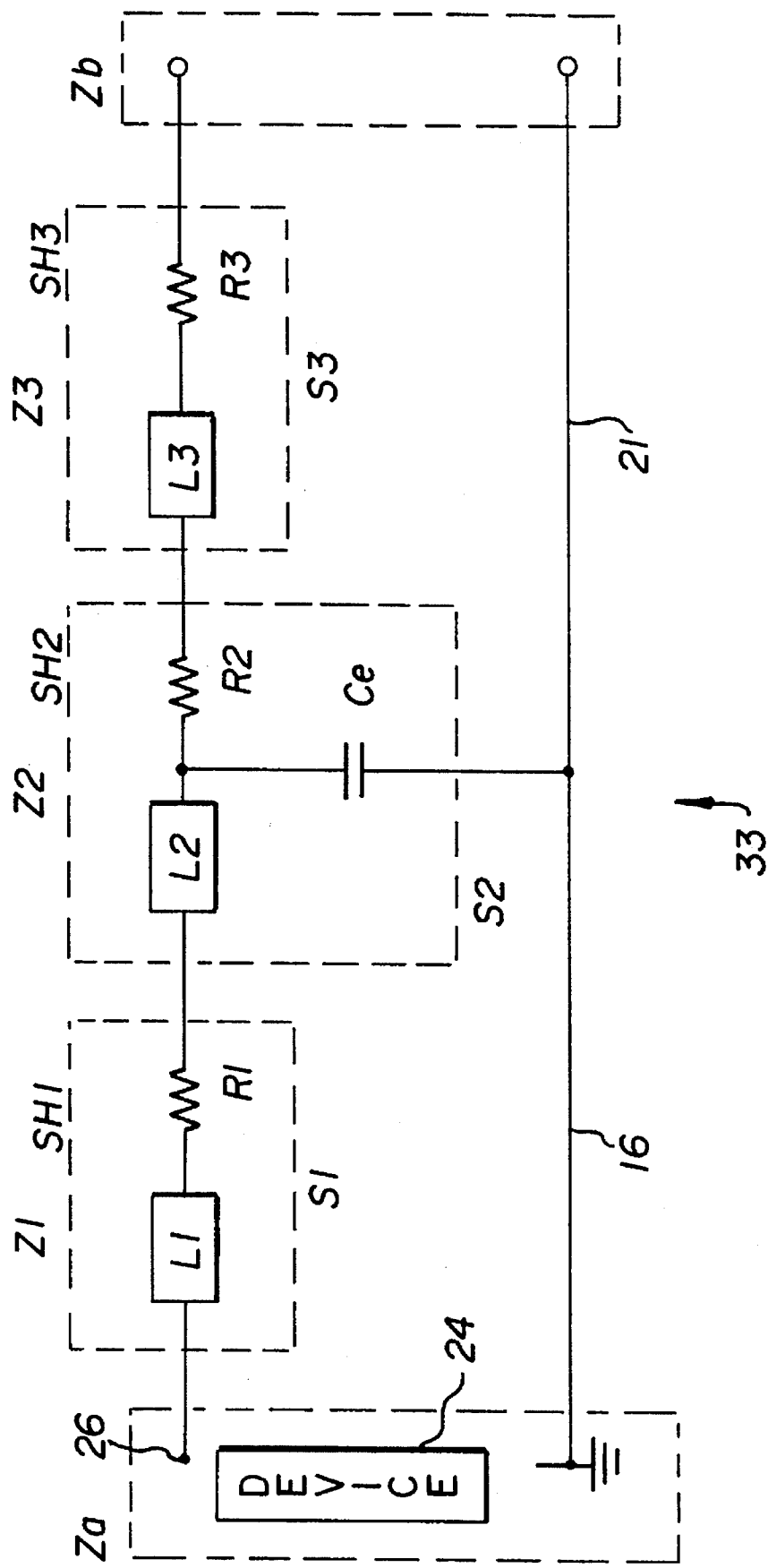
FIG. 3 is an equivalent circuit diagram of the device shown in FIGS. 1 and 2.

By way of illustration only, and not for limitation, matching circuit 33 formed by patterned metal layer 34 may be viewed as having three sections: input section S1, central section S2 and output section S3. Respective sections S1, S2 and S3 have: lengths 11, 12 and 13, respectively; widths W1, W2 and W3, respectively; and thicknesses t1, t2 and t3, respectively; defining shapes SH1, SH2 and SH3, respectively. While low loss sections S1, S2 and S3 are desired (ideally, R of zero), practical sections will have a small and equivalent (distributed) resistance R1, R2 and R3, respectively (see FIG. 3). Sections S1, S2, and S3 also have distributed inductances L1, L2 and L3, respectively, which are determined by the length, width, thickness and shape of the respective sections. Sections S1, S2 and S3 also have impedances Z1, Z2 and Z3, respectfully. Impedances Z1 and Z3 are determined primarily by resistances R1 and R3 respectively, and by inductances L1 and L3, respectively. The center, or central, section S2 impedance Z2 is determined by the combination of resistance R2, inductance L2 and by the effective capacitance Ce formed by section S2 of patterned metal layer 34, ground plane conductor 16, dielectric layer 30 and dielectric element 18. Effective capacitance $C_e$ is defined as, $$C_e = (C_p \times C_d)/(C_p + C_d)$$

where $C_p$ is the capacitance contribution due to dielectric element 18 and $C_d$ is the capacitance contribution due to dielectric layer 30. If capacitance $C_d$ of dielectric layer 30 is significantly larger than capacitance $C_p$ of dielectric element 18, then effective capacitance $C_e$ approaches the value of capacitance $C_p$ of dielectric element 18.

Effective capacitance $C_e$ can also be given by $$C_e = \frac{C_p}{(\epsilon_p t_d / \epsilon_d t_p) + 1}$$

where: $C_p$=capacitance of dielectric element 18; $\epsilon_p$=dielectric constant of dielectric element 18; $t_p$=thickness of dielectric element 18; $t_d$=thickness of dielectric layer 30; and $\epsilon_d$=dielectric constant of dielectric layer 30. In order to insure that effective capacitance $C_e$ is determined primarily by capacitance $C_p$ of dielectric element 18, dielectric layer 30 must have a high dielectric constant $\epsilon_d$, a relatively small thickness $t_d$ or some combination of the two. Since in HDI applications, one generally prefers that $\epsilon_d$ be low (less than or equal to 4), it is preferred that $t_d$ be small and $t_d/t_p$ be less than and preferably much less than one.

Impedances Z1, Z2 and Z3 form an impedance matching network 33 which is "off-chip," i.e. is not part of chip 24. Network 33 substantially matches impedance $Z_a$ of semiconductor device 24 to another impedance $Z_b$. The matching effect is determined by the combination of thickness, width, shape and dielectric constant of dielectric element 18, by the thickness and dielectric constant of dielectric layer 30, and by the resistances, lengths, widths and thicknesses of sections S1, S2 and S3 of patterned metal matching circuit 34.

Referring again to FIGS. 1 and 2, a second dielectric layer 36 made of another dielectric material with a different dielectric constant $\epsilon_3$, or, optionally the same material as layer 30, is deposited over patterned metal layer 34 and over portions of first dielectric layer 30. Additional via holes (not shown) and conducting vias 38 may be formed in dielectric layers 30 and 36 as necessary to the overall design of multichip module 10. Patterned metal layer 40 may be formed over second dielectric layer 36 in order to provide additional electrical interconnections as necessary to the overall design of multichip module 10. A third dielectric layer 42 and fourth layer (not shown) made of a similar material, or of another dielectric material (with a dielectric constant $\epsilon_4$), may be formed over patterned metal layer 40 thereby providing a base for additional metal layers (not shown) which may be used to provide additional electrical interconnections.

While the invention has been described in detail herein in accord with certain preferred embodiments thereof, many modifications and changes therein may be effected by those skilled in the art. Accordingly, it is our intent to be limited only by the scope of the appended claims and not by way of the details and instrumentalities describing the embodiments shown herein.

What is claimed is:

1. An electronic system comprising:

a substrate having an upper surface, said upper surface having first and second adjacent openings defining respective first and second chip-wells therein;

a conductive ground plane, including a first ground plane conductor disposed in said first chip-well and having an upper surface;

a dielectric element formed of a dielectric material having a dielectric constant $\epsilon_1$, and disposed upon said first ground plane conductor upper surface, said dielectric element having an upper surface;

a semiconductor device disposed in said second chip-well, said semiconductor device having an upper surface and at least one electrode disposed upon said upper surface, said semiconductor device also having an impedance $Z_a$ between a selected one of said at least one electrode and said ground plane;

a dielectric layer formed of a dielectric material having a dielectric constant $\epsilon_2$ and overlying at least a portion of each of said semiconductor device upper surface, said dielectric element upper surface and said substrate upper surface;

at least one patterned metal layer disposed upon said dielectric layer, in electrical contact with said semiconductor device selected electrode and in alignment over said dielectric element; said metal layer forming with said ground plane conductor, said dielectric element and said dielectric layer, an impedance-matching network at least partially matching said semiconductor device impedance $Z_a$ to an other impedance $Z_b$ external to said semiconductor device.

2. The electronic system of claim 1, wherein said patterned metal layer has a central section S2 having a selected length, a selected width and a selected thickness to provide an inductance L2 and a capacitance $C_e$ proportional to said central section length and width, a width and a thickness of the dielectric element and a thickness and dielectric constant $\epsilon_2$ of the dielectric layer.

3. The electronic system of claim 2, wherein said patterned metal layer also has an input section, between said device and said central section, having an inductance L1.

4. The electronic system of claim 3, wherein said patterned metal layer has an output section, between said central section and another impedance $Z_b$, having an inductance L3.

5. The electronic system of claim 1, wherein said first and second chip-wells are each part of a unitary cavity.

6. The electronic system of claim 1, wherein said dielectric element is formed of a material with dielectric constant $\epsilon_1 > 4$.

7. The electronic system of claim 6, wherein said dielectric element is fabricated from a material selected from the group consisting of BeO, AlN, $Al_2O_3$, (MgCa) $TiO_3$, ZrSn-$TiO_2$, and $CaTiO_3$.

8. The electronic system of claim 1, wherein said dielectric layer is fabricated from a material selected from the group consisting of polytetrafluoroparaxlene (Parylene).

9. The electronic system of claim 1, wherein said semiconductor device is a microwave device.

10. The electronic system of claim 9, wherein said microwave device is an active device.

11. An electronic system comprising:

an electrically conductive grounded substrate having an upper surface, said upper surface defining a conductive ground plane having first and second adjacent openings defining respective first and second chip-wells therein;

a dielectric element formed of a dielectric material having a dielectric constant $\epsilon_1$, and disposed within said first chip-well, said dielectric element having an upper surface;

a semiconductor device disposed in said second chip-well, said semiconductor device having an upper surface and at least one electrode disposed upon said upper surface, said semiconductor device also having an impedance $Z_a$ between a selected one of said at least one electrode and the ground plane of said grounded substrate;

a dielectric layer formed of a dielectric material having a dielectric constant $\epsilon_2$ and overlying at least a portion of each of said semiconductor device upper surface, said dielectric element upper surface and said substrate upper surface;

at least one patterned metal layer disposed upon said dielectric layer, in electrical contact with said selected semiconductor device electrode and in alignment over said dielectric element; said metal layer forming with said grounded substrate, said dielectric element and said dielectric layer, an impedance-matching network at least partially matching said semiconductor device impedance $Z_a$ to an other impedance $Z_b$ external to said semiconductor device.

12. The electronic system of claim 11, wherein said patterned metal layer has a central section S2 having a selected length, a selected width and a selected thickness to provide an inductance L2 and a capacitance $C_e$ proportional to said central section length and width, a width and a thickness of the dielectric element and a thickness and dielectric constant of the dielectric layer.

13. The electronic system of claim 12, wherein said patterned metal layer also has an input section, between said device and said central section, having an inductance L1.

14. The electronic system of claim 13, wherein said patterned metal layer has an output section, between said central section and another impedance Zb, having an inductance L3.

15. The electronic system of claim 11, wherein said first and second chip-wells are each part of a unitary cavity.

16. The electronic system of claim 11, wherein said dielectric element is formed of a material with dielectric constant $\epsilon_1 > 4$.

17. The electronic system of claim 16, wherein said dielectric element is fabricated from a material selected from the group consisting of BeO, AlN, $Al_2O_3$, (MgCa) $xTiO_3$, $ZrSnTiO_2$, and $CaTiO_3$.

18. The electronic system of claim 11, wherein said dielectric layer is fabricated from a material selected from the group consisting of polytetrafluoroparaxlene (Parylene).

19. The electronic system of claim 11, wherein said semiconductor device is a microwave device.

20. The electronic system of claim 19, wherein said microwave device is an active device.

* * * * *